(12) United States Patent
Chang (10) Patent No.: US 10,686,366 B2
(45) Date of Patent: Jun. 16, 2020

(54) FLYBACK POWER CONVERTER HAVING OVERLY HIGH VOLTAGE PROTECTION AND PRIMARY SIDE CONTROLLER CIRCUIT THEREOF

(71) Applicant: RICHTEK TECHNOLOGY CORPORATION, Zhubei, Hsinchu (TW)

(72) Inventor: Kuang-Fu Chang, KaoHsiung (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/395,341

(22) Filed: Apr. 26, 2019

(65) Prior Publication Data

US 2020/0014305 A1    Jan. 9, 2020

(30) Foreign Application Priority Data

Jul. 6, 2018  (CN) .......................... 2018 1 0735632

(51) Int. Cl.
*H02M 1/32* (2007.01)
*H03K 5/1254* (2006.01)
*H03K 5/24* (2006.01)
*H02M 3/335* (2006.01)
*H02M 1/00* (2006.01)

(52) U.S. Cl.
CPC ............ *H02M 1/32* (2013.01); *H02M 3/335* (2013.01); *H03K 5/1254* (2013.01); *H03K 5/24* (2013.01); *H02M 2001/0003* (2013.01)

(58) Field of Classification Search
CPC ............. H02M 2001/325; H02M 1/32; H02M 2001/0003; H02H 3/20
USPC .................................................. 363/50–56.05
See application file for complete search history.

(56) References Cited

U.S. PATENT DOCUMENTS

| | | | | |
|---|---|---|---|---|
| 2006/0227476 A1* | 10/2006 | Yang | ................. | H02M 3/33507 361/90 |
| 2008/0001589 A1* | 1/2008 | Shiroyama | .............. | H02M 1/32 323/282 |
| 2009/0153207 A1* | 6/2009 | Kraft | ....................... | H02M 1/32 327/172 |
| 2013/0100719 A1* | 4/2013 | Tzeng | ..................... | H02M 1/32 363/56.01 |

* cited by examiner

*Primary Examiner* — Alex Torres-Rivera
(74) *Attorney, Agent, or Firm* — Tung & Associates (57) ABSTRACT

A flyback power converter includes: a transformer, a primary side switch and a primary side controller circuit. The primary side controller circuit includes: a pulse modulation circuit and a protection control circuit. The pulse modulation circuit generates a pulse modulation signal. The protection control circuit is coupled to the pulse modulation circuit and compares an AC voltage related signal with an over voltage threshold. When the AC voltage related signal exceeds the over voltage threshold, the comparison circuit generates an over voltage protection trigger signal. When the pulse number of the over voltage protection trigger signal exceeds the over voltage counting threshold, the over voltage counter circuit triggers an over voltage protection signal, to indicate that an over voltage condition occurs, and a protection operation is performed.

17 Claims, 7 Drawing Sheets

FLYBACK POWER CONVERTER HAVING OVERLY HIGH VOLTAGE PROTECTION AND PRIMARY SIDE CONTROLLER CIRCUIT THEREOF

CROSS REFERENCE

The present invention claims priority to CN 201810735632.0, filed on Jul. 6, 2018.

BACKGROUND OF THE INVENTION

Field of Invention

The present invention relates to a flyback power converter. In particular, the present invention relates to such flyback power converter having overly high voltage protection. The present invention also relates to a controller circuit applied to such flyback power converter.

Description of Related Art

Figure 1:
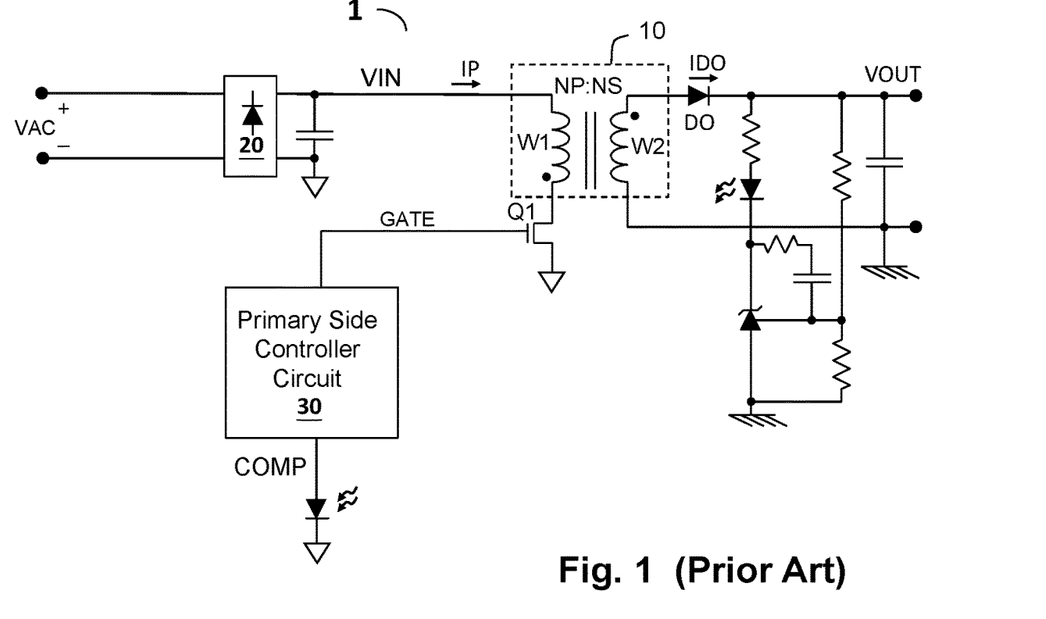
FIG. 1 shows a schematic diagram of a conventional flyback power converter.

Please refer to FIG. 1, which shows a schematic diagram of a conventional flyback power converter (i.e., flyback power converter 1). In an area where city power distribution is unstable, the voltage supplied by city power may be too high or too low, and when the input voltage which comes from the city power is too high, it may damage the primary side power device Q1 and the secondary side power device DO of the flyback power converter 1. To protect the power devices, it is required for the controller to include a protection mechanism capable of performing over voltage detection.

On the other hand, it is required for a flyback power converter to comply with a specification of surge test. However, the input voltage waveform for surge test is similar to the waveform of an overly high input voltage supplied from the city power, and it may accidentally trigger the protection mechanism.

As compared to the prior art shown in FIG. 1, the flyback power converter of the present invention can effectively detect whether the input voltage supplied from the city power is too high, to protect the flyback power converter, and on the other hand the present invention also can effectively distinguish an input voltage waveform for surge test from a waveform of overly high input voltage supplied from the city power, to avoid accidentally triggering the protection mechanism.

SUMMARY OF THE INVENTION

From one perspective, the present invention provides a flyback power converter, comprising: a transformer having a primary winding which is configured to operably receive an input voltage, and a secondary winding which is configured to generate an output voltage; a primary side switch coupled to the primary winding; and a primary side controller circuit at a primary side of the transformer, the primary side controller circuit being configured to operably generate a switch control signal to control the primary side switch, so as to control a conduction status of the primary winding, wherein the primary side controller circuit includes: a pulse modulation circuit, which is configured to operably generate a pulse modulation signal; and a protection control circuit coupled to the pulse modulation circuit; wherein the protection control circuit includes: a comparison circuit, which is configured to operably compare an AC voltage related signal with an over voltage threshold, wherein when the AC voltage related signal exceeds the over voltage threshold, the comparison circuit is configured to operably generate an over voltage protection trigger signal; wherein the AC voltage related signal and the input voltage are both related to an AC voltage; an over voltage counter circuit, which is configured to operably count the over voltage protection trigger signal, wherein when the count of the over voltage protection trigger signal exceeds the over voltage counting threshold, the over voltage counter circuit triggers an over voltage protection signal, to indicate that an over voltage condition occurs; and a protection logic circuit, which is configured to operably generate the switch control signal according to the over voltage protection signal and the pulse modulation signal, whereby a protection operation is performed when the over voltage condition occurs.

In one embodiment, the protection control circuit further includes a debounce circuit coupled between the comparison circuit and the over voltage counter circuit, the debounce circuit being configured to operably debounce a comparison result generated according to the comparison between the AC voltage related signal and the over voltage threshold, to generate the over voltage protection trigger signal; wherein when the AC voltage related signal exceeds the over voltage threshold VOV for a time period longer than an over voltage protection delay period, the debounce circuit generates the over voltage protection trigger signal.

In one embodiment, the protection control circuit further includes an overtime circuit, the overtime circuit being configured to, after the over voltage protection trigger signal has been triggered, but the over voltage protection trigger signal is not triggered again during a reset delay period, operably trigger an over voltage counting reset signal to reset the over voltage counter circuit.

In one embodiment, the protection operation includes: disabling the pulse modulation signal when the over voltage protection signal indicates that an over voltage condition occurs, so that the switch control signal ceases switching the primary side switch.

In one embodiment, when the over voltage counter circuit triggers the over voltage protection signal, the over voltage counter circuit further latches the over voltage protection signal, to indicate that an over voltage condition occurs.

In one embodiment, the overtime circuit includes an overtime counter, which is configured to operably count a clock pulse signal, so as to count the reset delay period.

In one embodiment, when the overtime circuit triggers the over voltage counting reset signal, the overtime circuit further latches the over voltage counting reset signal, to reset the count of the over voltage counter circuit.

In one embodiment, the overtime circuit adopts the pulse modulation signal as the clock pulse signal, to count the reset delay period.

In one embodiment, the over voltage protection delay period is smaller than a cycle period of the AC voltage related signal.

In one embodiment, the flyback power converter further comprises: a rectifier circuit, which is configured to operably rectify the AC voltage, to generate the AC voltage related signal.

From another perspective, the present invention provides a primary side controller circuit configured to operably control a flyback power converter, the flyback power converter comprising: a transformer having a primary winding which is configured to operably receive an input voltage, and a secondary winding which is configured to generate an output voltage; and a primary side switch coupled to the primary winding; the primary side controller circuit being at a primary side of the transformer, wherein the primary side controller circuit is configured to operably generate a switch control signal to control the primary side switch, so as to control a conduction status of the primary winding, the primary side controller circuit comprising: a transformer having a primary winding which is configured to operably receive an input voltage, and a secondary winding which is configured to generate an output voltage; a primary side switch coupled to the primary winding; and a primary side controller circuit at a primary side of the transformer, the primary side controller circuit being configured to operably generate a switch control signal to control the primary side switch, so as to control a conduction status of the primary winding, wherein the primary side controller circuit includes: a pulse modulation circuit, which is configured to operably generate a pulse modulation signal; and a protection control circuit coupled to the pulse modulation circuit; wherein the protection control circuit includes: a comparison circuit, which is configured to operably compare an AC voltage related signal with an over voltage threshold, wherein when the AC voltage related signal exceeds the over voltage threshold, the comparison circuit is configured to operably generate an over voltage protection trigger signal; wherein the AC voltage related signal and the input voltage are both related to an AC voltage; an over voltage counter circuit, which is configured to operably count the over voltage protection trigger signal, wherein when the count of the over voltage protection trigger signal exceeds the over voltage counting threshold, the over voltage counter circuit triggers an over voltage protection signal, to indicate that an over voltage condition occurs; and a protection logic circuit, which is configured to operably generate the switch control signal according to the over voltage protection signal and the pulse modulation signal, whereby a protection operation is performed when the over voltage condition occurs.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 2:
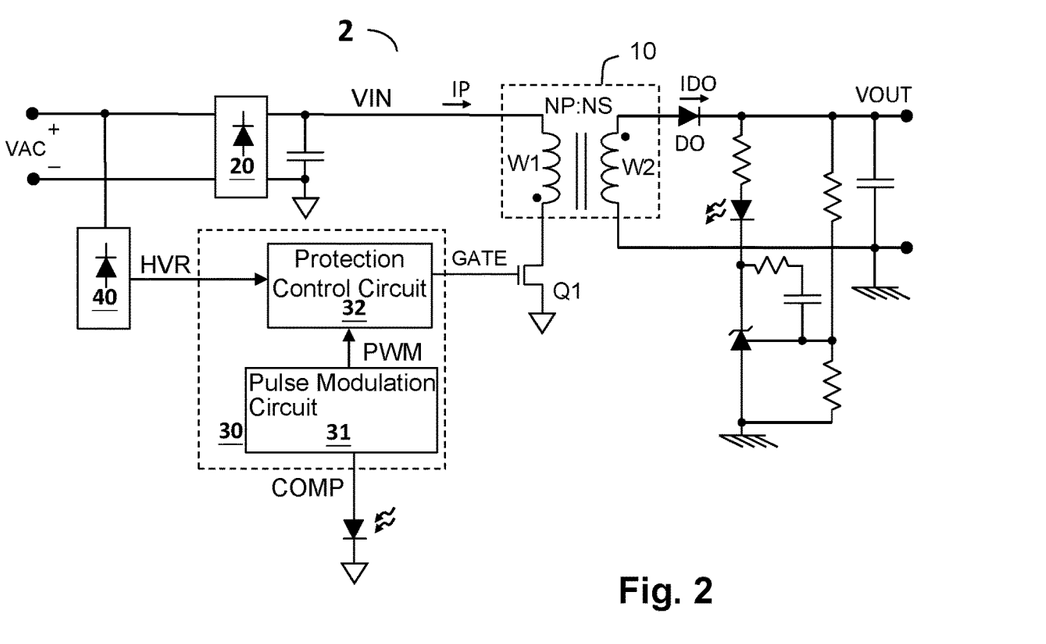
FIG. 2 shows a schematic diagram of a flyback power converter according to an embodiment of the present invention.

Please refer to FIG. 2, which shows a schematic diagram of a flyback power converter (i.e., flyback power converter 2) according to an embodiment of the present invention. The flyback power converter 2 comprises: a transformer 10, a primary side switch Q1 and a primary side controller circuit 30. The transformer 10 includes a primary winding W1 and a secondary winding W2. The primary winding W1 of the transformer 10 is configured to operably receive an input voltage VIN. The secondary winding W2 of the transformer 10 is configured to operably generate an output voltage VOUT. The primary side switch Q1 is coupled to the primary winding W1. The primary side controller circuit 30 is at a primary side of the transformer 10. The primary side controller circuit 30 is configured to operably generate a switch control signal GATE, to control the primary side switch Q1, so as to control the conduction status of the primary winding W1.

In one embodiment, the primary side controller circuit 30 includes: a pulse modulation circuit 31 and a protection control circuit 32. The pulse modulation circuit 31 is configured to operably generate a pulse modulation signal PWM. In one embodiment, the pulse modulation circuit 31 can perform for example but not limited to pulse width modulation according to a feedback compensation signal COMP, to generate the pulse modulation signal PWM, and the primary side controller circuit 30 generates the switch control signal GATE according to the pulse modulation signal PWM, so as to regulate, for example but not limited to, the output voltage VOUT. The protection control circuit 32 is configured to operably control the switch control signal GATE according to an AC voltage related signal HVR (which relates to an AC voltage VAC) and the pulse modulation signal PWM, so as to perform protection operation when the AC voltage VAC is too high (the details and the features as to how such protection operation is performed will be described later).

Figure 3:
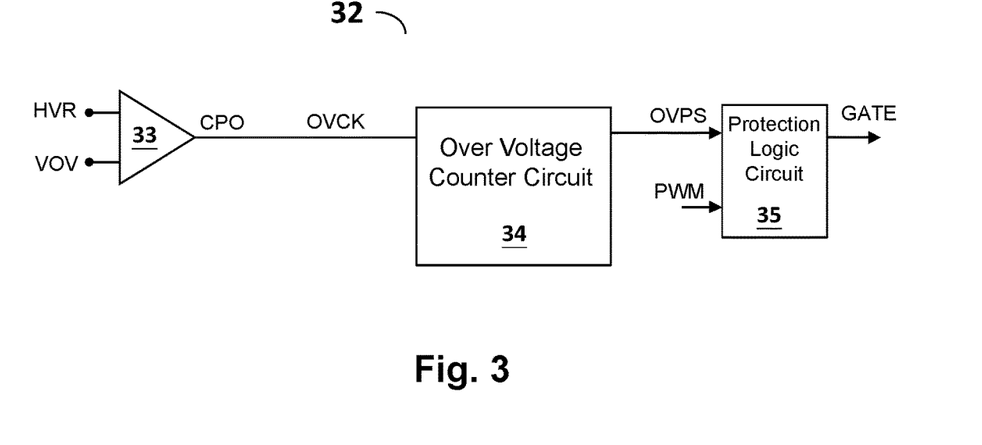
FIG. 3 shows an embodiment of a protection control circuit of the present invention.

Please refer to FIG. 3, which shows an embodiment of a protection control circuit (i.e., protection control circuit 32) according to the present invention. The protection control circuit 32 is coupled to the pulse modulation circuit 31. In this embodiment, the protection control circuit 32 includes, for example but not limited to, a comparison circuit 33, an over voltage counter circuit 34 and a protection logic circuit 35. The comparison circuit 33 is configured to operably compare the AC voltage related signal HVR with an over voltage threshold VOV; when the AC voltage related signal HVR exceeds (e.g., is greater than) the over voltage threshold VOV, an over voltage protection trigger signal OVCK is generated (the over voltage protection trigger signal OVCK is for example the comparison result CPO of the comparison circuit 33, or a signal generated according to a comparison result CPO; the latter will be explained later). In one embodiment, the over voltage protection trigger signal OVCK can be, for example but not limited to, a pulse. As shown in FIG. 2, the AC voltage related signal HVR and the input voltage VIN are both related to the AC voltage VAC. In one embodiment, the flyback power converter 2 further includes a rectifier circuit 20, which is configured to operably rectify the AC voltage VAC, to generate the input voltage VIN. In one embodiment, the flyback power converter 2 can further include a rectifier circuit 40, which is configured to operably rectify the AC voltage VAC, to generate the AC voltage related signal HVR. In one embodiment, the rectifier circuit 40 can be, for example but not limited to, a full-wave rectifier circuit. However, it is not necessary for the present invention to include a rectifier circuit 40; in another embodiment, the rectifier circuit 40 can be omitted. For example, the AC voltage related signal HVR can be directly electrically connected to the AC voltage VAC.

Please still refer to FIG. 3. The over voltage counter circuit 34 is configured to operably count a pulse number of the over voltage protection trigger signal OVCK. When the pulse number exceeds the over voltage counting threshold, the over voltage counter circuit 34 triggers an over voltage protection signal OVPS, to indicate that an over voltage condition occurs as reflected in the AC voltage related signal HVR. The protection logic circuit 35 is configured to operably generate the switch control signal GATE according to the over voltage protection signal OVPS and the pulse modulation signal PWM, and the protection logic circuit 35 performs a protection operation when an over voltage condition occurs. In one embodiment, the protection operation can include, for example but not limited to: disabling the pulse modulation signal PWM when the over voltage protection signal OVPS indicates that an over voltage condition occurs, so that the switch control signal GATE ceases switching the primary side switch Q1. In one embodiment, an AND gate may be adopted to perform logic operation according to a complementary signal of the over voltage protection signal OVPS, for disabling the pulse modulation signal PWM. On the other hand, in one embodiment, when no over voltage condition is occurring, the protection logic circuit 35 enables the pulse modulation signal PWM to generate the switch control signal GATE, and the thus generated switch control signal GATE can control the primary side switch Q1 to perform for example pulse width modulation.

Note that, as one of average skill in the art readily appreciates, the term "over voltage" as recited in the term "over voltage condition", as may be used herein, is meant to indicate a voltage that is undesirably high, which is not limited to a positive voltage, but may be a negative voltage having an overly high absolute value, that is, an absolute value of the AC voltage related signal HVR is greater than a threshold. In addition, the present invention is also applicable to overly low voltage detection and overly low voltage protection (under voltage detection and under voltage protection), wherein an absolute value of the AC voltage related signal HVR is smaller than a threshold. Therefore, the term. "over voltage" as may be used herein, includes the meanings of overly high voltage and/or overly low voltage, depending on the application of the circuitry.

Figure 4:
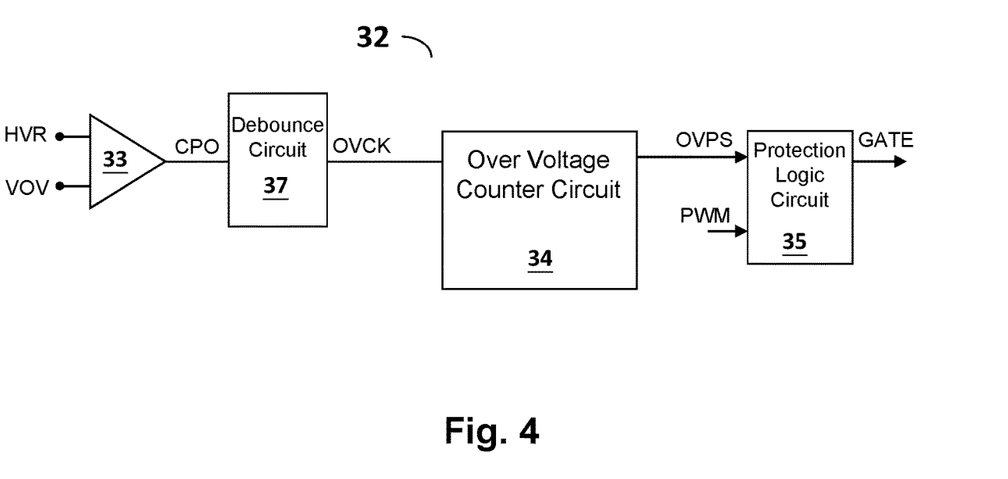
FIG. 4 shows another embodiment of a protection control circuit of the present invention.

Please refer to FIG. 4, which shows another embodiment of a protection control circuit according to the present invention. In this embodiment, the protection control circuit 32 further includes a debounce circuit 37 coupled between the comparison circuit 33 and the over voltage counter circuit 34. The debounce circuit 37 is configured to operably debounce a comparison result CPO generated according to the AC voltage related signal HVR and the over voltage threshold VOV, to generate the over voltage protection trigger signal OVCK. More specifically, the debounce circuit 37 will not generate the over voltage protection trigger signal OVCK unless the AC voltage related signal HVR exceeds the over voltage threshold VOV for a time period which is longer than an over voltage protection delay period TDB, so that short-time noises can be screened out. In one embodiment, the over voltage protection delay period TDB is smaller than a cycle period TP of the AC voltage related signal HVR.

Figure 5:
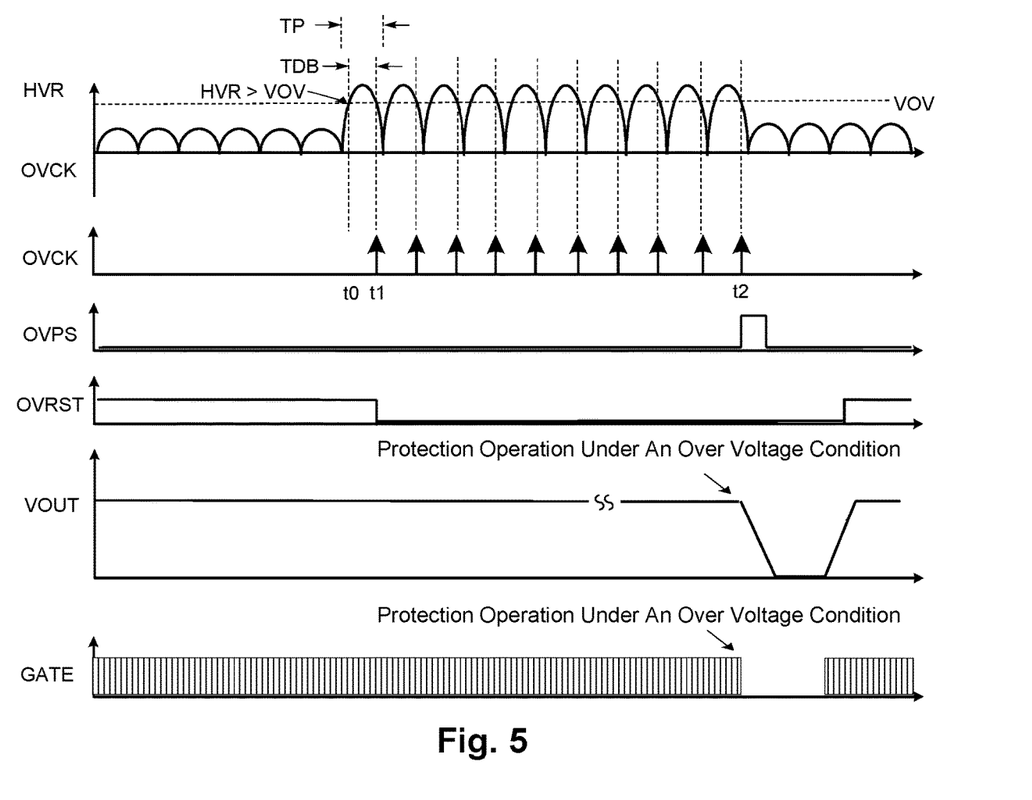
FIG. 5 shows waveforms corresponding to a flyback power converter of the present invention.

Please refer to FIG. 5 in conjugation with FIG. 4. FIG. 5 shows operational waveforms corresponding to a flyback power converter of the present invention. As shown in FIG. 5, when the AC voltage related signal HVR exceeds (e.g., is greater than) the over voltage threshold VOV, the comparison circuit 33 generates an over voltage protection trigger signal OVCK. In this embodiment shown in FIG. 5, the debounce circuit 37 generates the over voltage protection trigger signal OVCK when the AC voltage related signal HVR exceeds the over voltage threshold VOV for a time period which is longer than an over voltage protection delay period TDB (e.g., at time point t1). In this embodiment, the over voltage protection trigger signal OVCK is for example a pulse signal, as shown in FIG. 5. The over voltage counter circuit 34 counts a pulse number of the over voltage protection trigger signal OVCK. When the pulse number exceeds the over voltage counting threshold (such as but not limited to ten times in the example given in FIG. 5), the over voltage counter circuit 34 triggers an over voltage protection signal OVPS, to indicate that an over voltage condition occurs as reflected by the AC voltage related signal HVR (e.g., at time point t2, the over voltage protection signal OVPS is switched to high level). After the over voltage protection signal OVPS indicates that an over voltage condition occurs, the protection logic circuit 35 can disable the pulse modulation signal PWM, so that the switch control signal GATE ceases switching the primary side switch Q1 (e.g., after time point t2, the switch control signal GATE ceases switching). As a consequence, the flyback power converter 2 will be powered off or will reboot. As shown in the figure, after time point t2, the output voltage VOUT drops because the switch control signal GATE ceases switching. In the embodiment wherein the flyback power converter 2 is reboot, as shown in FIG. 5, the output voltage VOUT gradually recovers to the normal level when the switch control signal GATE restarts switching. In one embodiment, preferably, as shown in FIG. 5, the over voltage protection delay period TDB is smaller than the cycle period TP of the AC voltage related signal HVR.

Figure 6:
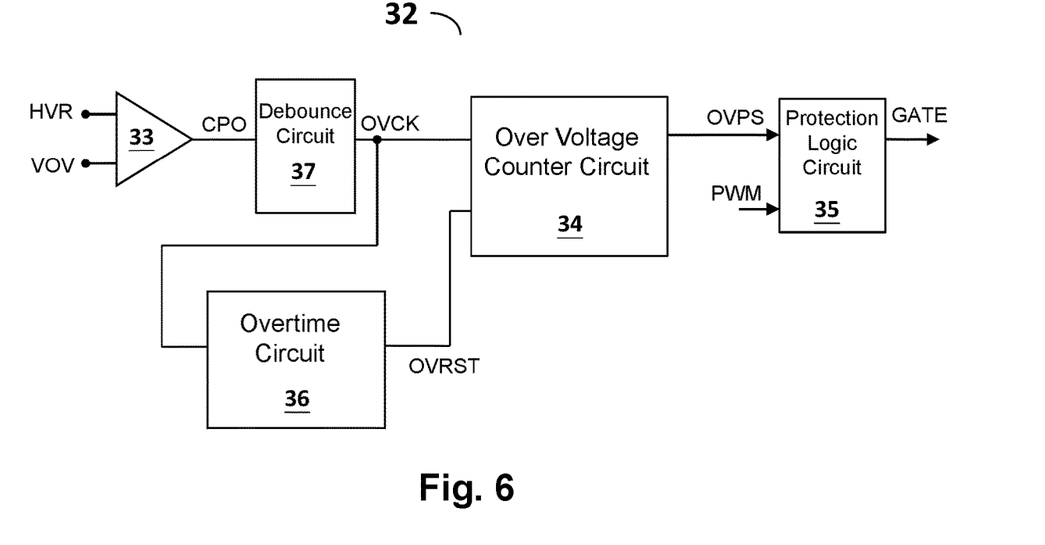
FIG. 6 shows yet another embodiment of a protection control circuit of the present invention.
Figure 7:
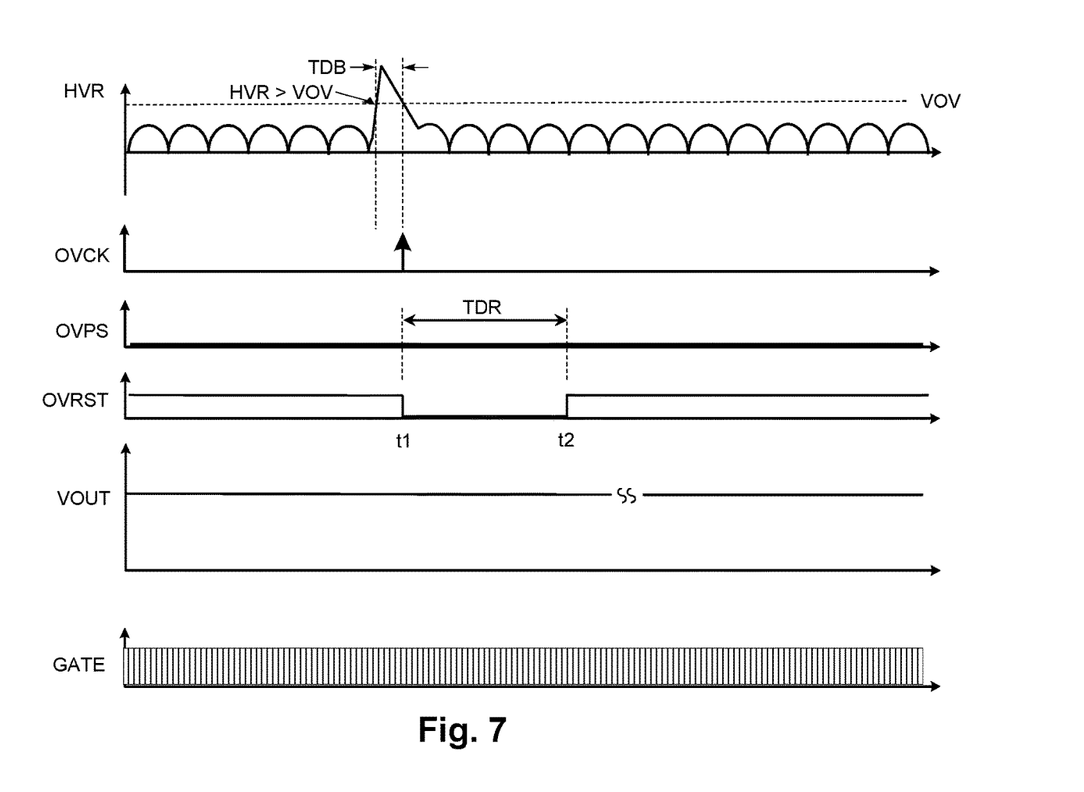
FIG. 7 shows waveforms corresponding to a flyback power converter of the present invention.

Please refer to FIG. 6 in conjugation with FIG. 7. FIG. 6 shows yet another embodiment of a protection control circuit according to the present invention. FIG. 7 shows operational waveforms corresponding to a flyback power converter of the present invention. In this embodiment, the protection control circuit 32 further includes an overtime circuit 36. The overtime circuit 36 is configured to, after the over voltage protection trigger signal OVCK has been triggered (i.e., when the AC voltage related signal HVR exceeds the over voltage threshold VOV for a time period longer than the over voltage protection delay period TDB, as shown at time point t1 in FIG. 7), but the over voltage protection trigger signal OVCK is not triggered again during a reset delay period TDR (e.g., as shown by the time period from t1 to t2 in FIG. 7), operably trigger an over voltage counting reset signal OVRST (e.g., in this embodiment, after time point t2, OVRST switches from low level to high level), to reset the count of the over voltage counter circuit 34. On the other hand, after the reset delay period TDR, if the over voltage protection trigger signal OVCK is triggered again, a new count will start.

Figure 8:
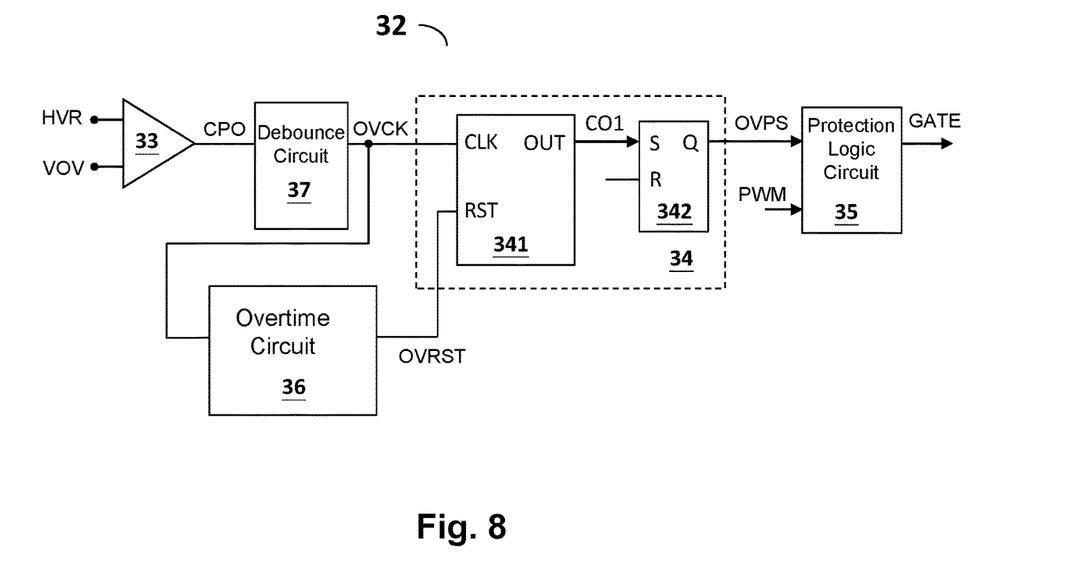
FIG. 8 shows an embodiment of an over voltage counter circuit of a protection control circuit.

Please refer to FIG. 8, which shows an embodiment of an over voltage counter circuit (i.e., over voltage counter circuit 34) of a protection control circuit according to the present invention. The over voltage counter circuit 34 includes an over voltage counter 341 and a latch circuit 342. The over voltage counter 341 is configured to operably count the above-mentioned over voltage protection trigger signal OVCK. The latch circuit 342 is configured to operably latch the over voltage protection signal OVPS, to indicate that the over voltage condition occurs as reflected by the AC voltage related signal HVR under a situation where the over voltage protection signal OVPS is triggered.

Figure 9A:
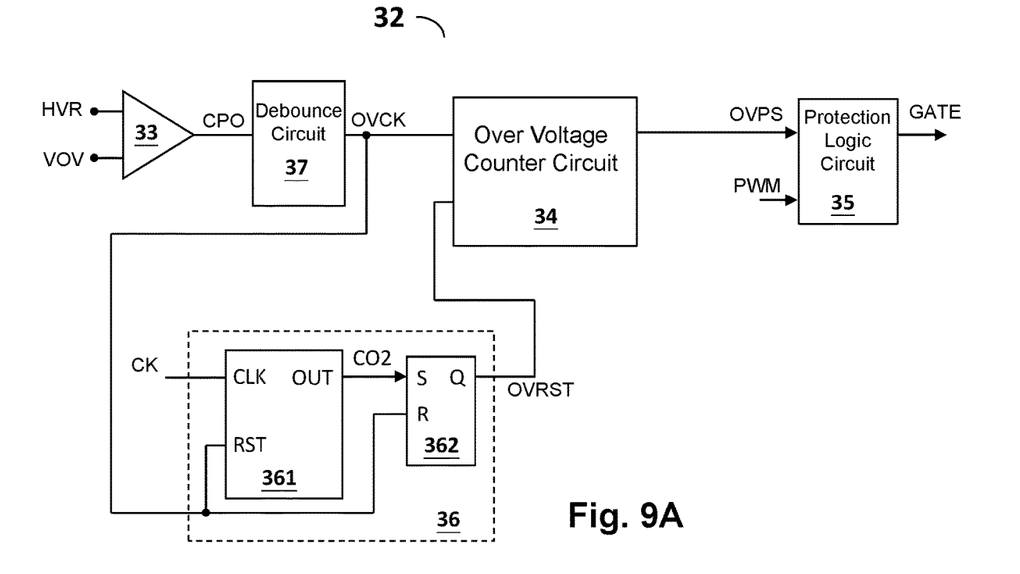
FIG. 9A shows an embodiment of an overtime circuit of a protection control circuit.
Figure 9B:
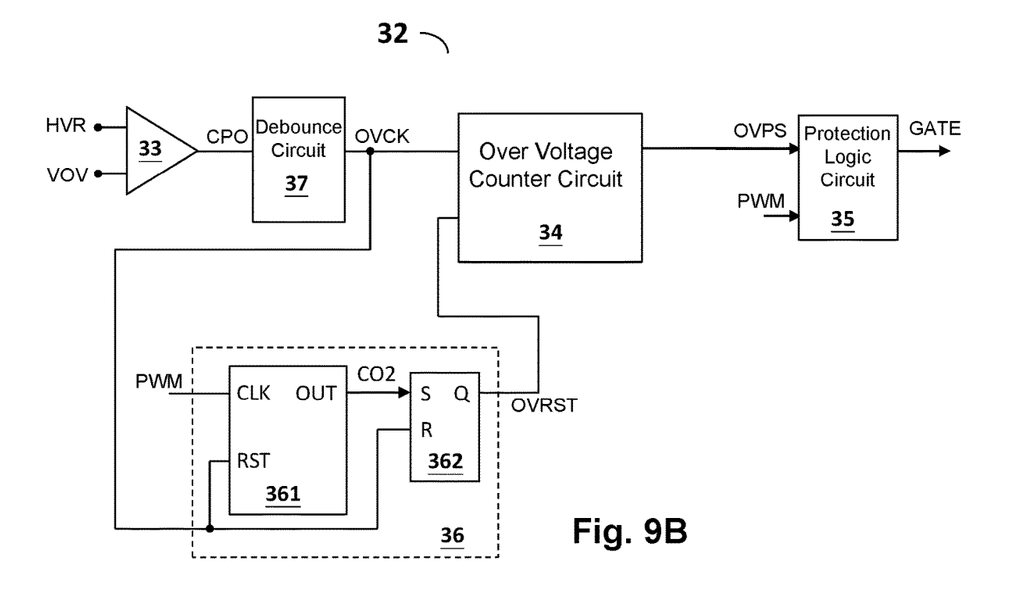
FIG. 9B shows an embodiment of a protection control circuit and an embodiment of an overtime circuit.

Please refer to FIG. 9A which shows an embodiment of an overtime circuit (i.e., overtime circuit 36) of a protection control circuit according to the present invention. The overtime circuit 36 includes an overtime counter 361 and a latch circuit 362. The overtime counter 361 is configured to operably count a clock pulse signal CK, to count the reset delay period TDR. Or, referring to FIG. 9B, in another embodiment, the overtime circuit 36 can adopt the pulse modulation signal PWM as the clock pulse signal CK, to count the reset delay period TDR. In one embodiment, as shown in FIG. 9A and FIG. 9B, the latch circuit 362 can latch the generated over voltage counting reset signal OVRST, to reset the count of the over voltage counter circuit 34.

Note that, in another embodiment, the above-mentioned latch circuit 342 or latch circuit 362 can be omitted. Under such circumstance, the output signal from the over voltage counter 341 and the output signal from the overtime counter 361 can be adopted as the over voltage protection signal OVPS and the over voltage counting reset signal OVRST, respectively.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described herein before to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A flyback power converter, comprising:
a transformer having a primary winding which is configured to operably receive an input voltage, and a secondary winding which is configured to generate an output voltage;
a primary side switch coupled to the primary winding; and
a primary side controller circuit at a primary side of the transformer, the primary side controller circuit being configured to operably generate a switch control signal to control the primary side switch, so as to control a conduction status of the primary winding, wherein the primary side controller circuit includes:
a pulse modulation circuit, which is configured to operably generate a pulse modulation signal; and
a protection control circuit coupled to the pulse modulation circuit;
wherein the protection control circuit includes:
a comparison circuit, which is configured to operably compare an AC voltage related signal with an over voltage threshold, wherein when the AC voltage related signal exceeds the over voltage threshold, the comparison circuit is configured to operably generate an over voltage protection trigger signal; wherein the AC voltage related signal and the input voltage are both related to an AC voltage;
an over voltage counter circuit, which is configured to operably count the over voltage protection trigger signal, wherein when the count of the over voltage protection trigger signal exceeds an over voltage counting threshold, the over voltage counter circuit triggers an over voltage protection signal, to indicate that an over voltage condition occurs;
a protection logic circuit, which is configured to operably generate the switch control signal according to the over voltage protection signal and the pulse modulation signal, whereby a protection operation is performed when the over voltage condition occurs; and
a debounce circuit, coupled between the comparison circuit and the over voltage counter circuit, the debounce circuit being configured to operably debounce a comparison result generated according to the comparison between the AC voltage related signal and the over voltage threshold, to generate the over voltage protection trigger signal; wherein when the AC voltage related signal exceeds the over voltage threshold for a time period longer than an over voltage protection delay period, the debounce circuit generates the over voltage protection trigger signal.

2. A flyback power converter, comprising:
a transformer having a primary winding which is configured to operably receive an input voltage, and a secondary winding which is configured to generate an output voltage;
a primary side switch coupled to the primary winding; and
a primary side controller circuit at a primary side of the transformer, the primary side controller circuit being configured to operably generate a switch control signal to control the primary side switch, so as to control a conduction status of the primary winding, wherein the primary side controller circuit includes:
a pulse modulation circuit, which is configured to operably generate a pulse modulation signal; and
a protection control circuit coupled to the pulse modulation circuit;
wherein the protection control circuit includes:
a comparison circuit, which is configured to operably compare an AC voltage related signal with an over voltage threshold, wherein when the AC voltage related signal exceeds the over voltage threshold, the comparison circuit is configured to operably generate an over voltage protection trigger signal; wherein the AC voltage related signal and the input voltage are both related to an AC voltage;

an over voltage counter circuit, which is configured to operably count the over voltage protection trigger signal, wherein when the count of the over voltage protection trigger signal exceeds an over voltage counting threshold, the over voltage counter circuit triggers an over voltage protection signal, to indicate that an over voltage condition occurs;

a protection logic circuit, which is configured to operably generate the switch control signal according to the over voltage protection signal and the pulse modulation signal, whereby a protection operation is performed when the over voltage condition occurs; and an overtime circuit, being configured to, after the over voltage protection trigger signal has been triggered, but the over voltage protection trigger signal is not triggered again during a reset delay period, operably trigger an over voltage counting reset signal to reset the over voltage counter circuit.

3. The flyback power converter of claim 1, wherein the protection operation includes: disabling the pulse modulation signal when the over voltage protection signal indicates that an over voltage condition occurs, so that the switch control signal ceases switching the primary side switch.

4. The flyback power converter of claim 1, wherein when the over voltage counter circuit triggers the over voltage protection signal, the over voltage counter circuit further latches the over voltage protection signal, to indicate that an over voltage condition occurs.

5. The flyback power converter of claim 2, wherein the overtime circuit includes an overtime counter, which is configured to operably count a clock pulse signal, so as to count the reset delay period.

6. The flyback power converter of claim 5, wherein when the overtime circuit triggers the over voltage counting reset signal, the overtime circuit further latches the over voltage counting reset signal, to reset the count of the over voltage counter circuit.

7. The flyback power converter of claim 5, wherein the overtime circuit adopts the pulse modulation signal as the clock pulse signal, to count the reset delay period.

8. The flyback power converter of claim 1, wherein the over voltage protection delay period is smaller than a cycle period of the AC voltage related signal.

9. The flyback power converter of claim 1, further comprising: a rectifier circuit, which is configured to operably rectify the AC voltage to generate the AC voltage related signal.

10. A primary side controller circuit configured to operably control a flyback power converter, the flyback power converter comprising: a transformer having a primary winding which is configured to operably receive an input voltage, and a secondary winding which is configured to generate an output voltage; and a primary side switch coupled to the primary winding; the primary side controller circuit being at a primary side of the transformer, wherein the primary side controller circuit is configured to operably generate a switch control signal to control the primary side switch, so as to control a conduction status of the primary winding, the primary side controller circuit comprising:

a pulse modulation circuit, which is configured to operably generate a pulse modulation signal; and a protection control circuit coupled to the pulse modulation circuit;

wherein the protection control circuit includes:

a comparison circuit, which is configured to operably compare an AC voltage related signal with an over voltage threshold, wherein when the AC voltage related signal exceeds the over voltage threshold, the comparison circuit is configured to operably generate an over voltage protection trigger signal; wherein the AC voltage related signal and the input voltage are both related to an AC voltage;

an over voltage counter circuit, which is configured to operably count the over voltage protection trigger signal, wherein when the count of the over voltage protection trigger signal exceeds an over voltage counting threshold, the over voltage counter circuit triggers an over voltage protection signal, to indicate that an over voltage condition occurs; and a debounce circuit, coupled between the comparison circuit and the over voltage counter circuit, the debounce circuit being configured to operably debounce a comparison result generated according to the comparison between the AC voltage related signal and the over voltage threshold, to generate the over voltage protection trigger signal; wherein when the AC voltage related signal exceeds the over voltage threshold for a time period longer than an over voltage protection delay period, the debounce circuit generates the over voltage protection trigger signal.

11. A primary side controller circuit configured to operably control a flyback power converter, the flyback power converter comprising: a transformer having a primary winding which is configured to operably receive an input voltage, and a secondary winding which is configured to generate an output voltage; and a primary side switch coupled to the primary winding; the primary side controller circuit being at a primary side of the transformer, wherein the primary side controller circuit is configured to operably generate a switch control signal to control the primary side switch, so as to control a conduction status of the primary winding, the primary side controller circuit comprising:

a pulse modulation circuit, which is configured to operably generate a pulse modulation signal; and a protection control circuit coupled to the pulse modulation circuit;

wherein the protection control circuit includes:

a comparison circuit, which is configured to operably compare an AC voltage related signal with an over voltage threshold, wherein when the AC voltage related signal exceeds the over voltage threshold, the comparison circuit is configured to operably generate an over voltage protection trigger signal; wherein the AC voltage related signal and the input voltage are both related to an AC voltage;

an over voltage counter circuit, which is configured to operably count the over voltage protection trigger signal, wherein when the count of the over voltage protection trigger signal exceeds an over voltage counting threshold, the over voltage counter circuit triggers an over voltage protection signal, to indicate that an over voltage condition occurs; and an overtime circuit, the overtime circuit being configured to, after the over voltage protection trigger signal has been triggered, but the over voltage protection trigger signal is not triggered again during a reset delay period, operably trigger an over voltage counting reset signal to reset the over voltage counter circuit.

12. The primary side controller circuit of claim 10, wherein the protection operation includes: disabling the pulse modulation signal when the over voltage protection signal indicates that an over voltage condition occurs, so that the switch control signal ceases switching the primary side switch.

13. The primary side controller circuit of claim 10, wherein when the over voltage counter circuit triggers the over voltage protection signal, the over voltage counter circuit further latches the over voltage protection signal, to indicate that an over voltage condition occurs.

14. The primary side controller circuit of claim 11, wherein t the overtime circuit includes an overtime counter, which is configured to operably count a clock pulse signal, so as to count the reset delay period.

15. The primary side controller circuit of claim 14, wherein when the overtime circuit triggers the over voltage counting reset signal, the overtime circuit further latches the over voltage counting reset signal, to reset the count of the over voltage counter circuit.

16. The primary side controller circuit of claim 14, wherein the overtime circuit adopts the pulse modulation signal as the clock pulse signal, to determine the reset delay period.

17. The primary side controller circuit of claim 10, wherein the over voltage protection delay period is smaller than a cycle period of the AC voltage related signal.

* * * * *